United States Patent [19]

Koyanagi

[11] Patent Number: 5,327,393
[45] Date of Patent: Jul. 5, 1994

[54] EXTERNAL MEMORY INTERFACE CIRCUIT CAPABLE OF CARRYING OUT INITIALIZATION OF EXTERNAL MEMORY WITH A REDUCED INITIALIZATION TIME DURATION

[75] Inventor: Mitsuhiro Koyanagi, Kanagawa, Japan

[73] Assignee: NEC Corporation, Tokyo, Japan

[21] Appl. No.: 67,610

[22] Filed: May 27, 1993

[30] Foreign Application Priority Data

May 27, 1992 [JP] Japan ................................. 4-134567

[51] Int. Cl.⁵ .............................................. G11C 8/04
[52] U.S. Cl. ................................ 365/233; 365/230.01;
365/189.01; 365/233.5
[58] Field of Search ................ 365/233, 230.01, 233.5,
365/236, 239, 240, 189.01, 189.12

[56] References Cited

U.S. PATENT DOCUMENTS

| | | | |
|---|---|---|---|
| 4,106,092 | 8/1978 | Millers, II | 395/275 |
| 4,162,520 | 7/1979 | Cook et al. | 395/275 |
| 4,937,791 | 6/1990 | Steele et al. | 365/230.01 |

Primary Examiner—Eugene R. LaRoche
Assistant Examiner—Tan Nguyen
Attorney, Agent, or Firm—Foley & Lardner

[57] ABSTRACT

In an external memory interface circuit included in a signal processing circuit which is for processing an input signal by using an external memory, the external memory interface circuit carries out initialization of the external memory on reception of a clear signal. In the initialization, an end address detecting circuit detects an end address of an address signal generated by an address generator and produces an end address detection signal. A signal generating circuit continuously generates an enable signal, a write-in pulse signal, and an address increment pulse signal until the signal generating circuit receives the end address detection signal after reception of the clear signal. A reset signal generating circuit generates an address reset signal on reception of the enable signal. A write-in register successively produces zero data while the write-in register receives the enable signal to write the zero data in the external memory in synchronism with the write-in pulse signal. The address register produces address zero on reception of the address reset signal and increasing the address of the external memory one by one in response to the address increment pulse signal.

2 Claims, 5 Drawing Sheets

EXTERNAL MEMORY INTERFACE CIRCUIT CAPABLE OF CARRYING OUT INITIALIZATION OF EXTERNAL MEMORY WITH A REDUCED INITIALIZATION TIME DURATION

BACKGROUND OF THE INVENTION

This invention relates to an external memory interface circuit included in a signal processing circuit which is for processing an input signal by using an external memory. Such a signal processing circuit is particularly useful in a voice signal processor of a microprogram control type for processing a voice signal.

In such a voice signal processor, it is often required to generate echo sound by processing an input signal, such as a voice signal, in order to obtain good sound effects. For this purpose, the voice signal processor comprises a signal processing circuit for processing the input signal and an external memory having a large capacity. The external memory is for giving a predetermined delay to the input signal. As well known in the art, the input signal having the predetermined delay is used for generating the echo sound.

The signal processing circuit is connected to an external central processing unit (CPU) and carries out a signal processing operation in accordance with a predetermined signal processing program. The predetermined signal processing program is transferred from the external central processing unit to the signal processing circuit on starting of the signal processing operation. In order to temporarily storing the predetermined signal processing program, the signal processing circuit comprises an instruction RAM (random access memory). The signal processing circuit further comprises an external memory interface circuit for carrying out input/output control of the input signal in the signal processing operation.

In the meanwhile, the external memory must be initialized previous to the signal processing operation. In initialization of the external memory, the signal processing circuit writes zero data in all addresses of the external memory by using the external memory interface circuit. The signal processing circuit carries out the initialization of the external memory in accordance with an initialization program. The initialization program is also transferred from the external central processing unit to the signal processing circuit and is temporarily stored in the instruction RAM. When the initialization completes, the initialization program in the instruction RAM is replaced by the predetermined signal processing program.

As apparent from the above description, the signal processing circuit requires the initialization program in order to carry out the initialization. Furthermore, the initialization program must be replaced by the predetermined signal processing program on completion of the initialization. This means that the signal processing circuit requires an extra or unnecessary time duration before the signal processing circuit starts the signal processing operation. In other words, the signal processing circuit requires an increased initialization time duration for carrying out the initialization. Moreover, the load on the external central processing unit increases because the external central processing unit must carry out transfer operation of the initialization program.

SUMMARY OF THE INVENTION

It is therefore an object of this invention to provide an external memory interface circuit capable of carrying out initialization of an external memory with a reduced initialization time duration.

It is another object of this invention to provide the external memory interface circuit capable of reducing load on an external central processing unit.

Other objects of this invention will become clear as the description proceeds.

On describing the gist of this invention, it is possible to understand that an external memory interface circuit is included in a signal processing circuit which is for processing an input signal by using an external memory connected to the signal processing circuit. The signal processing circuit comprises clear signal generating means for generating a clear signal designating initialization of the external memory. The external memory interface circuit is connected to the clear signal generating means and comprises an address register for producing an address signal representing an address of the external memory at a time to supply the address signal to the external memory and a write-in register for writing the input signal in the external memory. The external memory interface circuit carries out the initialization of the external memory on reception of the clear signal.

According to this invention, the external memory interface circuit further comprises end address detecting means connected to the address register for detecting an end address of the address signal to produce an end address detection signal, signal generating means connected to the clear signal generating means and the end address detecting means for continuously generating an enable signal, a write-in pulse signal, and an address increment pulse signal until the signal generating means receives the end address detection signal after reception of the clear signal. The signal generating means supplies the enable signal, the write-in pulse signal, and the address increment pulse signal to the write-in register, the external memory, and the address register, respectively. The external memory interface circuit still further comprises reset signal generating means connected to the signal generating means for generating an address reset signal on reception of the enable signal to supply the address reset signal to the address register. The write-in register successively produces zero data while the write-in register receives the enable signal to successively write the zero data in the external memory in synchronism with the write-in pulse signal. The address register produces address zero on reception of the address reset signal and increasing the address of the external memory one by one in response to the address increment pulse signal.

DESCRIPTION OF THE PREFERRED EMBODIMENT

Figure 1:
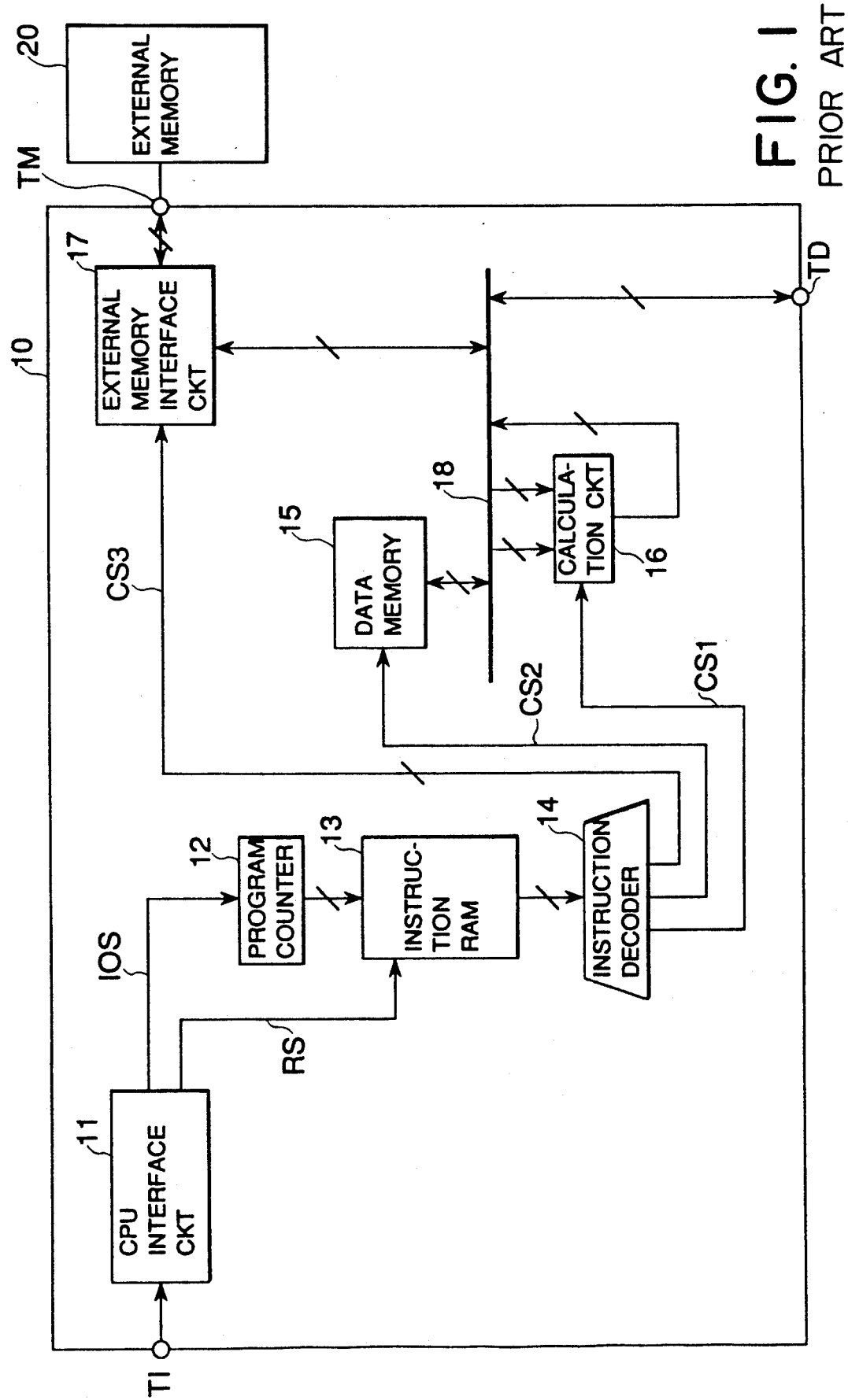
FIG. 1 is a block diagram of a conventional signal processing circuit together with an external memory.
Figure 2:
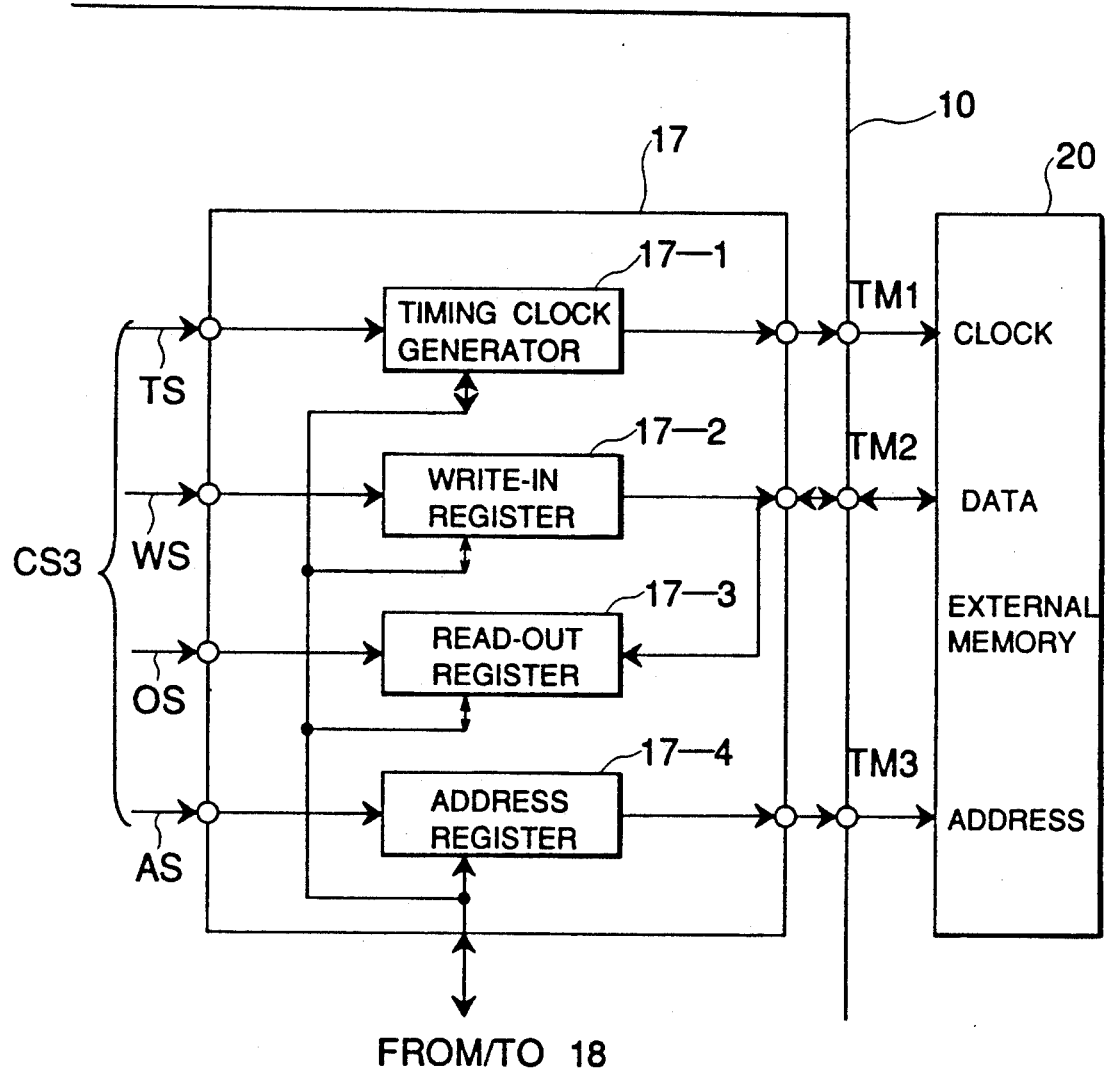
FIG. 2 is a block diagram of an external memory interface circuit illustrated in FIG. 1.

Referring to FIGS. 1 and 2, a conventional signal processing circuit and a conventional external memory interface circuit included in the signal processing circuit will be described at first in order to facilitate an understanding of the present invention.

In FIG. 1, the signal processing circuit 10 is connected to an external CPU (central processing unit) (not shown) and an external memory 20 through an instruction input terminal TI and a memory terminal group TM, respectively. As will later be described, the memory terminal group TM comprises a plurality of memory terminals. The signal processing circuit 10 is supplied with an input signal, such as a voice signal, through a data input/output terminal TD and processes the input signal in accordance with a predetermined signal processing program. The signal processing circuit 10 produces a processed signal through the data input/output terminal TD.

The signal processing circuit 10 comprises a CPU interface circuit 11, a program counter 12, an instruction RAM (random access memory) 13, an instruction decoder 14, a data memory 15, a calculation circuit 16, and an external memory interface circuit 17. The data memory 15, the calculation circuit 16, and the external memory interface circuit 17 are connected to each other through a data bus 18.

The CPU interface circuit 11 is for carrying out input/output control of an instruction command supplied from the external CPU and delivers an interface output signal IOS and an RAM control signal RS to the program counter 12 and the instruction RAM 13, respectively. The program counter 12 is for designating an address of the instruction RAM 13 in response to the interface output signal IOS. The instruction RAM 13 is for storing the predetermined signal processing program in accordance with the RAM control signal RS and supplies an instruction signal representative of an instruction to the instruction decoder 14. The instruction decoder 14 decodes the instruction signal and produces first through third control signals CS1, CS2, and CS3. In accordance with the first control signal CS1, the calculation circuit 16 carries out a predetermined calculation which is necessary for processing the input signal. The data memory 15 is for memorizing data which are necessary for the predetermined calculation. The external memory interface circuit 17 is for giving a predetermined delay to the input signal by using the external memory 20 in order to generate echo sound.

In FIG. 2, the external memory interface circuit 17 is supplied with the third control signal CS3 and comprises a timing clock generator 17-1, a write-in register 17-2, a read-out register 17-3, and an address register 17-4. The third control signal CS3 consists of a timing signal TS, a write-in instruction signal WS, a read-out instruction signal OS, and an address designating signal AS. The timing clock generator 17-1 is for generating a timing clock signal consisting of a sequence of timing clock pulses in response to the timing signal TS. The timing clock signal is supplied to the external memory 20 through a first memory terminal TM1. The write-in register 17-2 is for storing the input signal in the external memory 20, in response to the write-in instruction signal WS, in synchronism with the timing clock signal The input signal is supplied to the external memory 20 through a second memory terminal TM2. The external memory 20 memorizes the input signal as a memorized input signal. Supplied with the read-out instruction signal OS, the read-out register 17-3 reads the memorized input signal out of the external memory 20 through the second memory terminal TM2 as a read-out input signal in synchronism with the timing clock signal and delivers the read-out input signal to the data bus 18. The address register 17-4 is for generating an address signal representative of an address of the external memory 20 at a time in response to the address designating signal AS. The address signal is supplied to the external memory 20 through a third memory terminal TM3. The first through the third memory terminals TM1 to TM3 are collectively called the memory terminal group TM described in conjunction with FIG. 1.

Previous to signal processing operation by the signal processing circuit 10, the external memory 20 must be initialized. This is because the external memory 20 which is not initialized may have random data which are not suitable for the signal processing operation. In brief, the initialization of the external memory 20 is for writing zero data in all addresses of the external memory 20. Initialization of the external memory 20 is carried out by the signal processing circuit 10 in accordance with an initialization program when the signal processing circuit 10 receives an initialization instruction signal from the external CPU through the instruction input terminal TI. The external CPU transfers the initialization program to the signal processing circuit 10. On reception of the initialization instruction signal, the CPU interface circuit 11 delivers the interface output signal IOS designating reset of the program counter 12 and delivers the RAM control signal RS designating write instruction of the instruction RAM 13. Then, the initialization program is stored in the instruction RAM 13. The instruction RAM 13 supplies the instruction signal to the instruction decoder 14 in accordance with the initialization program. The instruction decoder 14 decodes the instruction signal and delivers the third control signal CS3 to the external memory interface circuit 17.

At a first of the initialization, the address register 17-4 supplies the address signal representative of address zero, namely, a start address, to the external memory 20. Simultaneously, the write-in register 17-2 supplies the zero data to the external memory 20 while the timing clock generator 17-1 supplies the timing clock signal to the external memory 20. Thus, the zero data are written in the address zero of the external memory 20. Next, the address register 17-4 supplies the address signal representative of address one to the external memory 20. Simultaneously, the write-in register 17-2 supplies the zero data to the external memory 20 and the timing clock generator 17-1 supplies the timing clock signal to the external memory 20. As a result, the zero data are written in the address one of the external memory 20. The above-mentioned operation is repeated by increasing the address of the external memory 20 one by one by the address register 17-4 until the address reaches at an end address of the external memory 20. Thus, the zero data are written in all addresses of the external memory 20 and the signal processing circuit 10 completes the initialization.

When the initialization completes, the external CPU transfers the predetermined signal processing program to the signal processing circuit 10. The initialization program stored in the instruction RAM is replaced by the predetermined signal processing program by the CPU interface circuit 11. The signal processing circuit 10 carries out the signal processing operation in accordance with the predetermined signal processing program.

As apparent from the above description, the initialization program must be stored in the instruction RAM 13 because the external memory interface circuit 17 has no function for initializing the external memory 20. This means that the signal processing circuit 10 has to replace the initialization program by the predetermined signal processing program on completion of the initialization of the external memory 20. The signal processing circuit 10 requires an increased initialization time duration in order to carry out the initialization. In other words, the signal processing circuit 10 requires an extra time duration before the signal processing circuit 10 starts the signal processing operation. Moreover, the load on the external CPU increases because the external CPU has to transfer the initialization program to the signal processing circuit 10.

Figure 3:
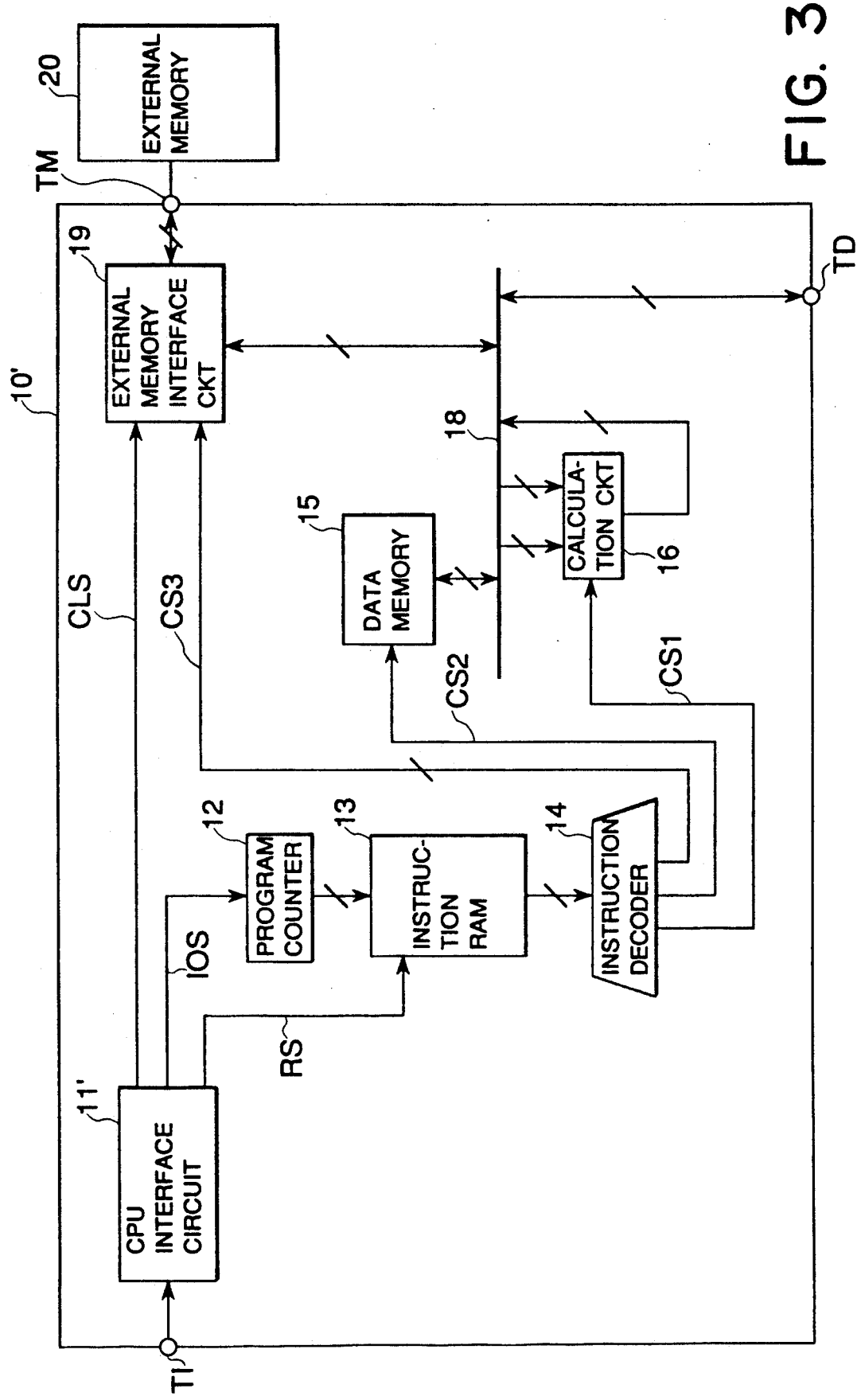
FIG. 3 is a block diagram of a signal processing circuit which is applied to this invention.
Figure 4:
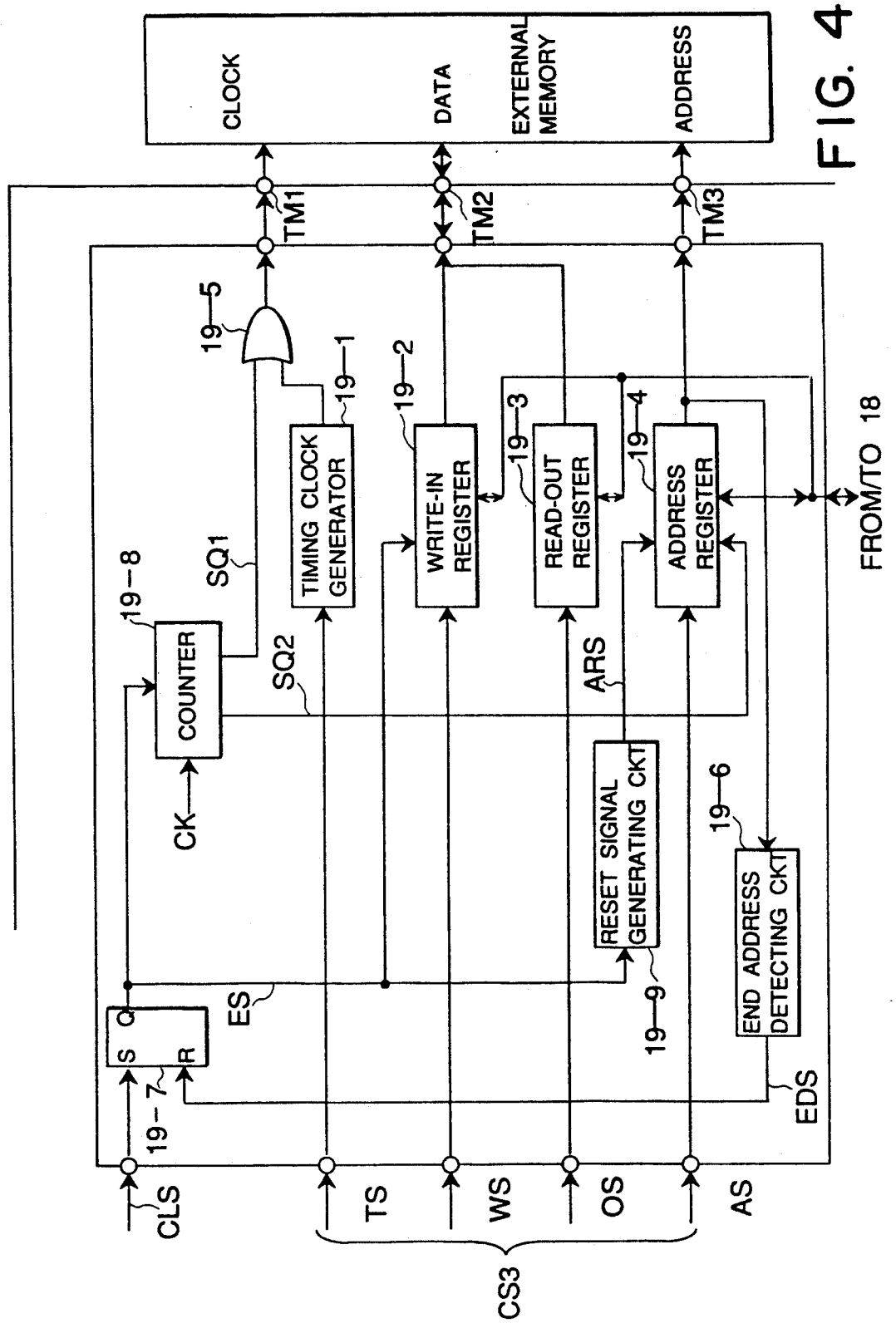
FIG. 4 is a block diagram of an external memory interface circuit according to an embodiment of this invention.

Referring to FIGS. 3 and 4, the description will be made as regards a signal processing circuit and an external memory interface circuit according to a preferred embodiment of this invention.

In FIG. 3, the signal processing circuit 10' is similar to that illustrated in FIG. 1 except that a CPU interface circuit 11' generates a clear signal CLS on reception of the initialization instruction signal delivered from the external CPU and supplies the clear signal CLS to an external memory interface circuit 19. The CPU interface circuit 11' may therefore be called a clear signal generating circuit. Inasmuch as the signal processing circuit 1' carries out the signal processing operation similar to that described in conjunction with FIG. 1, the signal processing operation will not be described any longer.

In FIG. 4, the external memory interface circuit 19 is supplied with the third control signal CS3 described in conjunction with FIG. 2 and comprises a timing clock generator 19-1, a write-in register 19-2, a read-out register 19-3, and an address register 19-4. With regard to the function necessary for the signal processing operation, these components have the same functions with the timing clock generator 17-1, the write-in register 17-2, the read-out register 17-3, and the address register 17-4 which are illustrated in FIG. 2. Namely, the timing clock generator 19-1 generates a timing clock signal consisting of a sequence of timing clock pulses in response to the timing signal TS. The timing clock signal is supplied to the external memory 20 through an OR gate 19-5. The write-in register 19-2 is for storing the input signal in the external memory 20, in response to the write-in instruction signal WS, in synchronism with the timing clock signal. The input signal is supplied to the external memory 20 through the second memory terminal TM2. The external memory 20 memorizes the input signal as the memorized input signal. Supplied with the read-out instruction signal OS, the read-out register 19-3 reads the memorized input signal out of the external memory 20 through the second memory terminal TM2 as a read-out input signal in synchronism with the timing clock signal and delivers the read-out input signal to the data bus 18. The address register 19-4 generates an address signal representative of the address of the external memory 20 at a time in response to the address designating signal AS. The address signal is supplied to the external memory 20 through the third memory terminal TM3.

In order to carry out the initialization of the external memory 20, the external memory interface circuit 19 further comprises an end address detecting circuit 19-6, a flip-flop circuit 19-7, a counter 19-8, and a reset signal generating circuit 19-9 in addition to the OR gate 19-5. These components operate in the initialization of the external memory 20. The end address detecting circuit 19-6 is connected to the address register 19-4 and detects an end address of the address signal to produce an end address detection signal EDS on detection of the end address. The flip-flop circuit 19-7 is supplied with the clear signal CLS as a set signal from the CPU interface circuit 11' and supplied with the end address detection signal EDS as a reset signal from the end address detecting circuit 19-6. The flip-flop circuit 19-7 continuously produces an enable signal ES until the flip-flop circuit 19-7 receives the end address detection signal EDS after reception of the clear signal CLS supplied from the CPU interface circuit 11'. The enable signal ES is supplied to the write-in register 19-2, the counter 19-8, and the address register 19-4. The enable signal ES may be called a flip-flop output signal. The counter 19-8 is connected to the flip-flop circuit 19-7 and is supplied with a clock pulse signal CK consisting of a sequence of clock pulses. The counter 19-8 counts the sequence of clock pulses while the counter 19-8 receives the enable signal ES and produces first and second count signals SQ1 and SQ2. The first count signal SQ1 is supplied to the external memory 20 through the OR gate 19-5 as a write-in pulse signal. The second count signal SQ2 is supplied to the address register 19-4 as an address increment pulse signal. The flip-flop circuit 19-7 and the counter 19-8 may collectively be called a signal generating circuit.

The reset signal generating circuit 19-9 is connected to the flip-flop circuit 19-7 and generates an address reset signal ARS on reception of the enable signal ES to supply the address reset signal ARS to the address register 19-4. As will later be described, the write-in register 19-2 successively produces zero data while the write-in register 19-2 receives the enable signal ES in order to successively write the zero data in the external memory 20 in synchronism with the first count signal SQ1, namely, the write-in pulse signal. The address register 19-4 produces address zero on reception of the address reset signal ARS and increasing the address of the external memory 20 one by one in response to the second count signal SQ2, namely, the address increment pulse signal.

Figure 5:
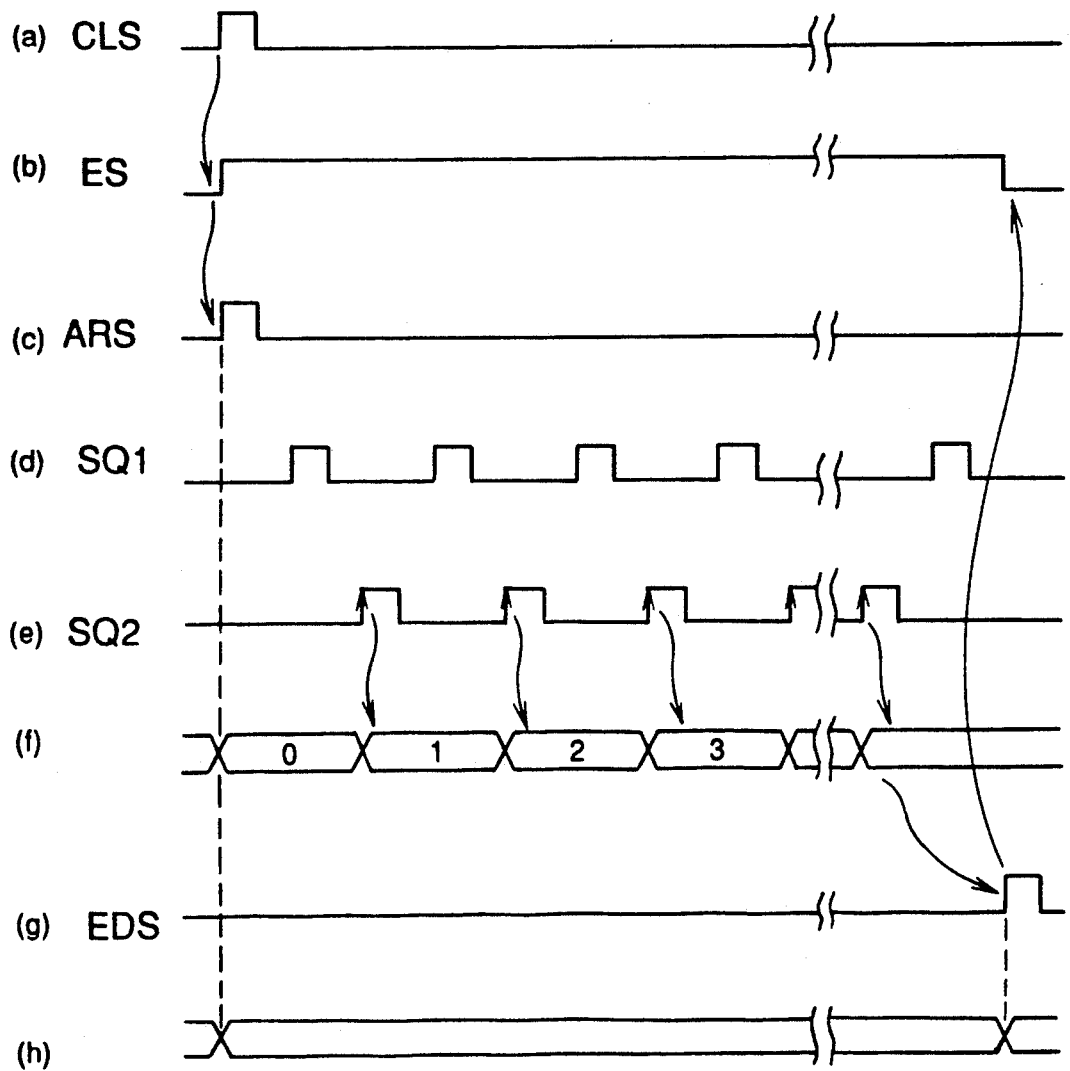
FIG. 5 is a time chart for use in describing initialization operation of the external memory interface circuit illustrated in FIG. 4.

Referring to FIG. 5 together with FIGS. 3 and 4, the description will proceed to the initialization of the external memory 20. When the CPU interface circuit 11' receives the initialization instruction signal from the external CPU, the CPU interface circuit 11' produces the clear signal CLS as shown in a top line of FIG. 5. The flip-flop circuit 19-7 is set by the clear signal CLS and produces the enable signal ES having a logic one value as shown in a second line of FIG. 5. The enable signal ES sets the write-in register 19-2 at an initial state. As will become clear, the write-in register 19-2 successively supplies zero data, as shown in a bottom line of FIG. 5, to the external memory 20 until the flip-flop circuit 19-7 is reset. The enable signal ES is further supplied to the reset signal generating circuit 19-9. On reception of the enable signal ES, the reset signal generating circuit 19-9 generates the address reset signal ARS as shown in a third line of FIG. 5. The address reset signal ARS resets the address of the address register 19-4 to zero.

Furthermore, the enable signal ES is supplied to the counter 19-8. While the counter 19-8 receives the enable signal ES, the counter 19-8 counts the clock pulses of the clock pulse signal CK and produces the first count signal SQ1 as shown in a fourth line of FIG. 5 and the second count signal SQ2 as shown in a fifth line of FIG. 5. As mentioned before, the first count signal SQ1 serves as the write-in pulse signal for the external memory 20. The zero data delivered from the write-in register 19-2 are written in the external memory 20 when the first count signal SQ1 has the logic one value. The second count signal SQ2 serves as the address increment pulse signal for increasing the address of the address register 19-4 one by one. Responsive to the second count signal SQ2, the address register 19-4 successively supplies the address signal representative of the address 20 of the external memory 20 as shown in a sixth line of FIG. 5. Thus, the zero data delivered from the write-in register 19-2 are successively written in all addresses of the external memory 20 in address order.

When the address register 19-4 delivers the address signal having the end address of the external memory 20, the end address detecting circuit 19-6 detects the end address and delivers the end address detection signal EDS to the flip-flop circuit 19-7 as shown in a seventh line of FIG. 5. The end address detection signal EDS resets the flip-flop circuit 19-7. As a result, the flip-flop circuit 19-7 stops production of the enable signal ES. Thus, the external memory interface circuit 19 can carry out the initialization of the external memory 20 without the initialization program. In other words, the initialization is carried out without an extra time duration.

When the initialization completes, the predetermined signal processing program transferred from the external CPU is stored in the instruction RAM 13 (FIG. 3) through the CPU interface circuit 11'. The signal processing circuit 10' can start the signal processing operation without delay in accordance with the predetermined signal processing program. Furthermore, the load on the external CPU can be reduced because the external CPU does not have to transfer the initialization program.

While this invention has thus far been described in conjunction with a preferred embodiment thereof, it will readily be possible for those skilled in the art to put this invention into practice in various other manners.

What is claimed is:

1. An external memory interface circuit included in a signal processing circuit which is for processing an input signal by using an external memory connected to said signal processing circuit, said signal processing circuit comprising clear signal generating means for generating a clear signal designating initialization of said external memory, said external memory interface circuit being connected to said clear signal generating means and comprising an address register for producing an address signal representing an address of said external memory at a time to supply said address signal to said external memory and a write-in register for writing said input signal in said external memory, said external memory interface circuit carrying out said initialization of said external memory on reception of said clear signal and further comprising:
    end address detecting means connected to said address register for detecting an end address of said address signal to produce an end address detection signal;
    signal generating means connected to said clear signal generating means and said end address detecting means for continuously generating an enable signal, a write-in pulse signal, and an address increment pulse signal until said signal generating means receives said end address detection signal after reception of said clear signal, said signal generating means supplying said enable signal, said write-in pulse signal, and said address increment pulse signal to said write-in register, said external memory, and said address register, respectively; and
    reset signal generating means connected to said signal generating means for generating an address reset signal on reception of said enable signal to supply said address reset signal to said address register;
    said write-in register successively producing zero data while said write-in register receives said enable signal to successively write said zero data in said external memory in synchronism with said write-in pulse signal, said address register producing address zero on reception of said address reset signal and increasing said address of said external memory one by one in response to said address increment pulse signal.

2. An external memory interface circuit as claimed in claim 1, wherein said signal generating means comprises:
    a flip-flop circuit connected to said clear signal generating means and said end address detecting means for continuously producing a flip-flop output signal as said enable signal until said flip-flop circuit receives said end address detection signal after reception of said clear signal; and
    a counter connected to said flip-flop circuit and supplied with a clock pulse signal consisting of a sequence of clock pulses for counting said sequence of clock pulses while said counter circuit receives said flip-flop output signal to produce first and second count signals as said write-in pulse and said address increment pulse signals, respectively.

* * * * *